United States Patent [19]

Kazami et al.

[11] Patent Number: 5,032,542

[45] Date of Patent: Jul. 16, 1991

[54] METHOD OF MASS-PRODUCING INTEGRATED CIRCUIT DEVICES USING STRIP LEAD FRAME

[75] Inventors: Akira Kazami, Tochigi; Masakazu Yamagishi, Gunma; Sumio Ishihara, Gunma; Kiyoshi Takahashi, Gunma, all of Japan

[73] Assignee: Sanyo Electric Co., Ltd., Osaka, Japan

[21] Appl. No.: 429,410

[22] Filed: Oct. 31, 1989

[30] Foreign Application Priority Data

| Nov. 18, 1988 | [JP] | Japan | 63-292888 |
| Nov. 18, 1988 | [JP] | Japan | 63-292889 |
| Dec. 16, 1988 | [JP] | Japan | 63-318754 |

[51] Int. Cl.[5] .............................................. H01L 21/98
[52] U.S. Cl. ..................................... 437/206; 437/220; 174/52.4
[58] Field of Search .................. 437/206, 220; 29/827; 361/398; 428/571, 572; 174/52.4; 357/70, 74, 68, 80; 156/656; 264/272.17

[56] References Cited

U.S. PATENT DOCUMENTS

| 3,611,061 | 10/1971 | Segerson | 428/572 |
| 3,821,847 | 7/1974 | Melse et al. | 29/827 |
| 4,426,773 | 1/1984 | Hargis | 437/206 |
| 4,946,633 | 7/1990 | Saeki et al. | 264/272.17 |

FOREIGN PATENT DOCUMENTS

| 0106475 | 4/1984 | European Pat. Off. | 437/220 |
| 57-93557 | 6/1982 | Japan | 29/827 |
| 63-29414 | 6/1988 | Japan . | |

*Primary Examiner*—Olik Chaudhuri
*Assistant Examiner*—David E. Graybill
*Attorney, Agent, or Firm*—Darby & Darby

[57] ABSTRACT

A method of mass-producing IC devices includes the steps of: forming a plurality of types of conductor patterns on a ribbonlike insulating substrate, separating the ribbonlike substrate to form a plurality of types of divided substrates, causing at least one of the conductor patterns of the same type to be included in each of the divided substrates, and sending the divided substrates including the conductor patterns of the same type to the same dedicated assembling line.

20 Claims, 11 Drawing Sheets

FIG.2B PRIOR ART
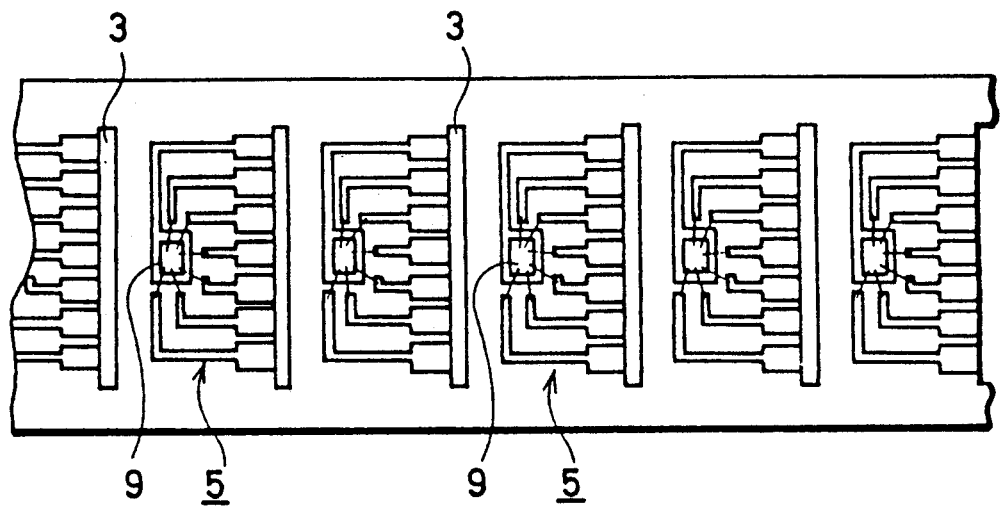
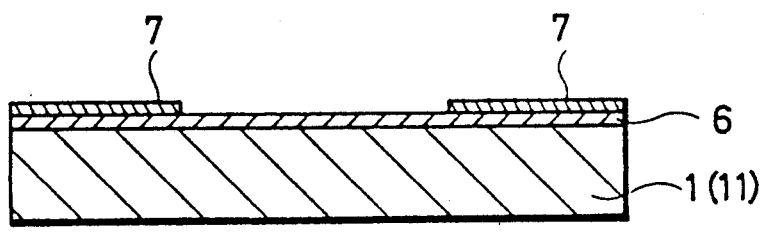
FIG.3A
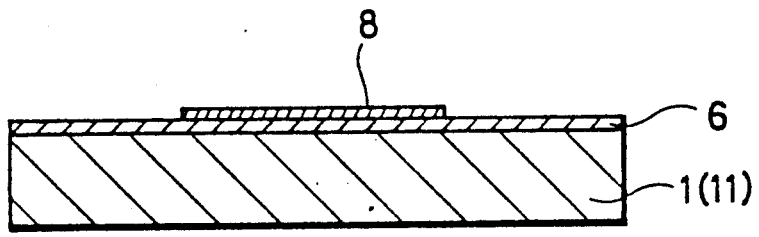
FIG.3B
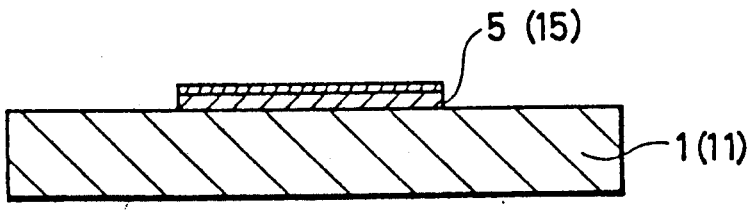
FIG.3C

DIE BONDING   WIRE BONDING

DIE BONDING    WIRE BONDING

METHOD OF MASS-PRODUCING INTEGRATED CIRCUIT DEVICES USING STRIP LEAD FRAME

BACKGROUND OF THE INVENTION

1. Field of the Invention

The present invention relates to methods of mass-producing integrated circuit (IC) devices and particularly to a method of mass-producing simultaneously a plurality of types of IC devices.

2. Description of the Background Art

Referring to FIG. 1A, a part of a ribbonlike substrate used in a method of mass-producing IC devices disclosed in Japanese Patent Publication No. 63-29414(/1988) is shown in a plan view. The substrate 1 is formed of an aluminum plate of $70 \times 1000 \times 1$ mm$^3$ for example and a film of aluminum oxide is formed on a surface of the substrate 1 by well-known anodization. Index holes 2 are punched at prescribed intervals by a press along edges of both sides of the substrate 1 in its length direction. The index holes 2 define partitions 4 surrounded by chain lines. Each partition 4 crosses the ribbonlike substrate 1 in its width direction. The ribbonlike substrate 1 in FIG. 1A is a substrate for relatively small IC devices and each partition 4 is divided into two regions 4a and 4b by slits 3a punched by a press. One IC device is formed on each of those regions 4a and 4b.

Referring to FIG. 1B, a part of another ribbonlike substrate disclosed in Japanese Patent Publication No. 63-29414 is shown. The substrate in FIG. 1B is similar to that in FIG. 1A, except that index slits 3 are punched in the substrate in FIG. 1B in place of the index holes 2. The index slits 3 define partitions 4 as surrounded by the chain lines. The ribbonlike substrate 1 in FIG. 1B is a substrate for relatively large IC devices and one IC devices formed on each of those partitions 4.

Referring to FIGS. 2A and 2B, a manufacturing process of IC devices using the substrate 1 in FIG. 1B is illustrated. The substrate 1 is moved for each partition 4 by a transport machine (not shown) utilizing the index slits 3 as registering means, so that conductor patterns 5 are formed on the respective partitions 4. A semiconductor IC die 9 is fixed on a pad 51 in each conductor pattern 5 by conductive paste. An electrode on the semiconductor IC die 9 is connected to corresponding conductors in the conductor pattern 5 by wire bonding using fine wires of gold or aluminum. Although the identical conductor patterns 5 are shown in all the partitions 4 in FIGS. 2A and 2B, different patterns may be formed in different partitions 4.

Referring to FIGS. 3A, 3B and 3C, steps of forming a conductor pattern 5 are illustrated in sectional views. A foil 6 of metal such as copper is adhered on an anodized surface of an aluminum substrate 1. A resist pattern 7 is formed on the copper foil 6 by screen process printing. Using the resist pattern 7 as a mask, the copper foil 6 is plated with a precious metal 8 (such as gold, silver or platinum) and after that the resist pattern 7 is removed. Then, using the precious metal plated layer 8 as a mask, the copper foil 6 is etched, whereby the conductor pattern 5 is formed. On this occasion, the respective conductors in the conductor pattern 5 can be formed with a width as small as about 0.5 mm.

However, if a conductor pattern including narrower conductors is desired, the respective conductors may be formed with a width as narrow as about 2 $\mu$m by using well-known photolithography. A conductor pattern including very fine conductors can be applied to a large scale integrated circuit (LSI) device or a high frequency circuit having a large number of connection pins.

If resistors are incorporated in a conductor pattern, those resistors can be formed by printing and baking a pattern of a resisting coating material on the substrate 1 by a screen process.

Further, an interfacial insulating layer of polyimide or the like is further formed on the conductor pattern 5 and a pattern of a conductive coating material is printed and baked on the interfacial insulating layer by a screen process, whereby a multilayer connection pattern can be formed.

As shown in FIG. 2B, the ribbonlike substrate 1 where the IC devices are formed is moved for each partition 4 by utilizing the index slits 3 so that the functions of those IC devices are tested. On this occasion, if the conductor pattern 5 includes a resistor pattern, function adjustment of the IC devices can be effected by functional trimming of the resistor pattern. In addition, if any semiconductor IC die 9 contains a defect, it can be replaced with a new semiconductor IC die and thus the production yield of IC devices can be improved. Further, if desired, the adhesion intensity of the bonding wires can be measured. The semiconductor IC dies 9 and the bonding wires can be formed by coating of silicon resin or by partial molding in a transfer molding process.

The ribbonlike substrate 1 holding the plurality of IC devices which have been tested is moved for each partition 4 by utilizing the index slits 3 as marks, so that the respective IC devices are separated individually by a press machine. In this pressing process, only the peripheral portions of a male mold contact the substrate 1 and accordingly no adverse effect is exerted on the respective IC dies 9 or conductor patterns 5 on the substrate 1.

Each separated IC device, to which external leads are soldered, is enclosed in a resin case or dipped in epoxy resin. Thus, the manufacturing of each IC device is completed.

In the above described mass-producing method of IC devices, identical IC devices are normally formed in a plurality of partitions 4; however, different IC devices may be formed in different partitions 4. However, since the substrate 1 is separated for each IC device after the IC devices have been formed in all the partitions 4, the substrate 1 needs to pass through assembling lines for all types of IC devices. More specifically, in the case of forming a plurality of types of IC devices on the substrate 1, the manufacturing efficiency is considerably lowered.

SUMMARY OF THE INVENTION

In view of the above described prior art, an object of the present invention is to provide a method for mass-producing a plurality of types of IC devices efficiently.

A method of mass-producing IC devices according to the present invention includes the steps of: forming a plurality of types of conductor patterns on a ribbonlike insulating substrate, separating the ribbonlike substrate to form a plurality of types of divided substrates so that at least one of conductor patterns of only the same type is included in each divided substrate, moving the divided substrates including the same conductor patterns to the same dedicated assembling line, fixing a semiconductor IC die on each conductor pattern on the divided substrate, and wire-bonding an electrode on each semiconductor IC die to corresponding conductors in the conductor pattern.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2A and 2B are plan views illustrating a manufacturing process of IC devices using the substrate in FIG. 1B.

FIGS. 3A, 3B and 3C are sectional views showing steps of forming a conductor pattern.

DESCRIPTION OF THE PREFERRED EMBODIMENTS

Referring to FIGS. 4A to 4E, a method of mass-producing a plurality of types of IC devices according to an embodiment of the present invention is illustrated.

Figure 1A:
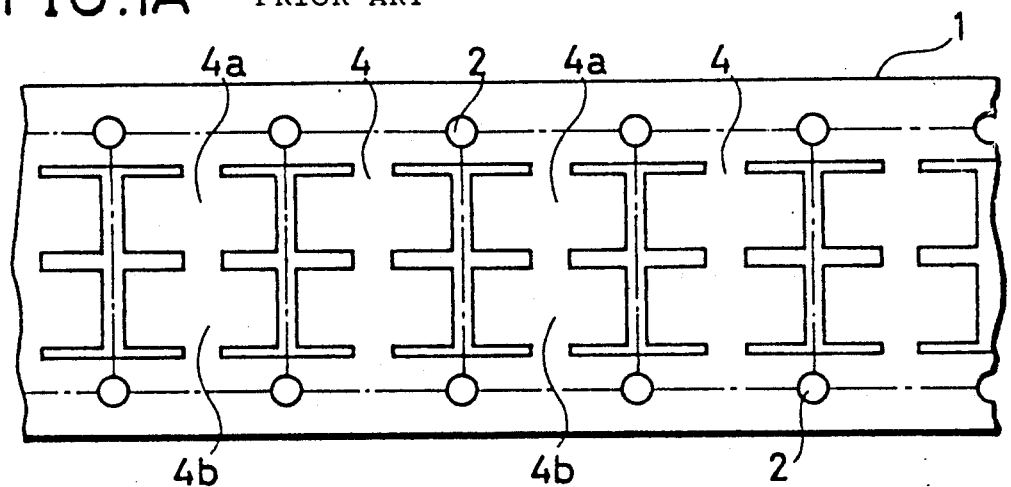
FIGS. 1A and 1B are plan views showing a ribbonlike substrate used in a conventional mass-producing method of IC devices.
Figure 1B:
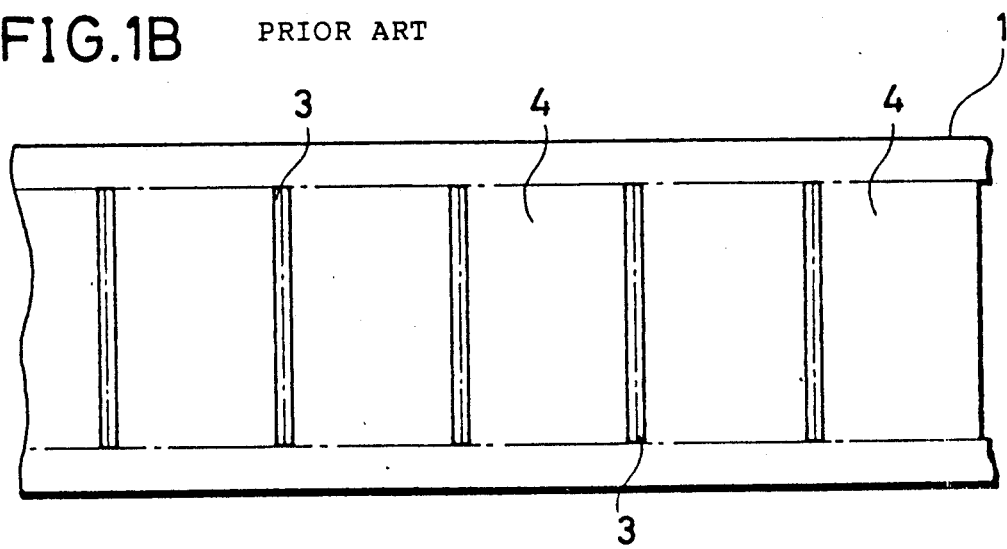
Figure 2A:
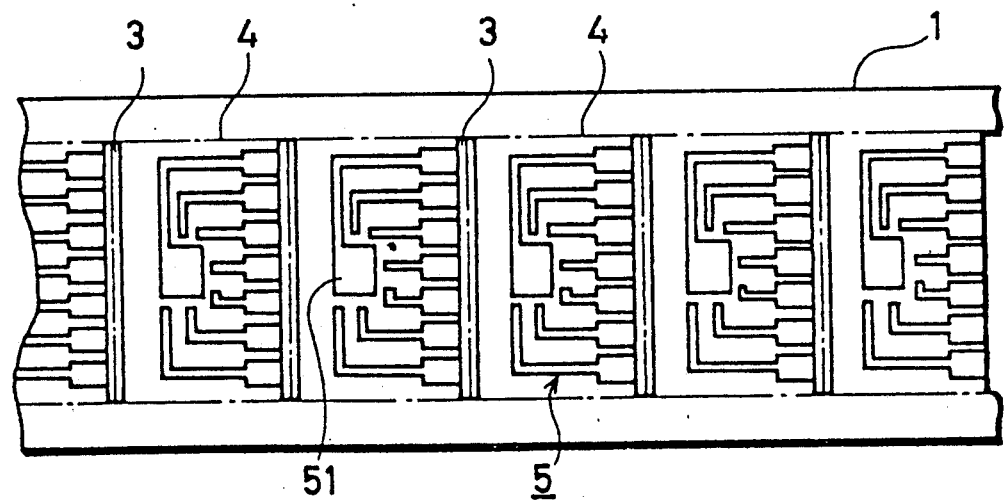
Figure 4A:
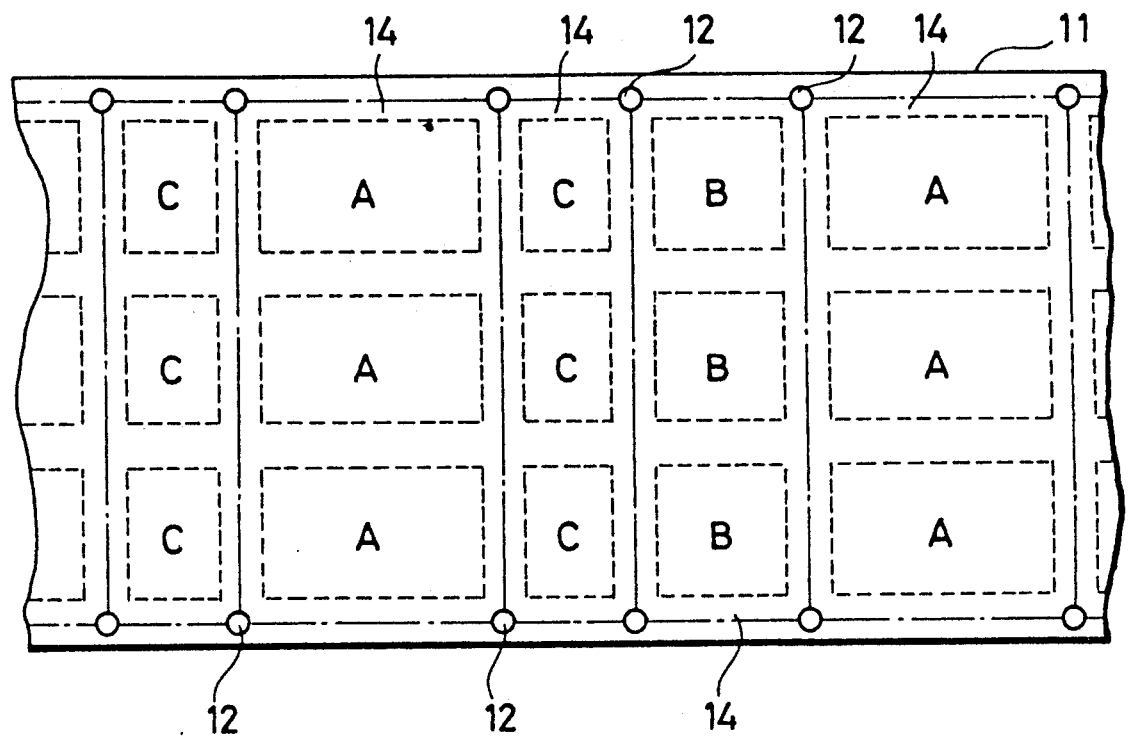
FIGS. 4A to 4E are plan views illustrating a mass-producing method of IC devices according to an embodiment of the present invention.

Referring to FIG. 4A, index holes 12 are formed at prescribed intervals along edges of both sides of a ribbonlike insulating substrate 11 in its length direction. The insulating substrate 11 may be formed of an aluminum sheet having an anodized surface for example and it has an area of 1000×100000 mm² and a thickness in the range of 0.5 to 1 mm for example. This substrate 11 is transported from a roller of 10 m in diameter for example and the index holes 12 are punched in the substrate 11 by a press machine. The index holes 12 define partitions represented as being surrounded by chain lines. The partitions 14 cross the ribbonlike substrate 11 in its width direction. In FIG. 4A, three types of partitions 14 having different areas are defined. Three conductor patterns 4A for example having relatively large dimensions are formed in each of the partitions 14 of the first type having a relatively large area. Three conductor patterns B for example having intermediate dimensions are formed in each of the partitions 14 of the second type having an intermediate area. Three conductor patterns C for example of relatively small dimensions are formed in each of the partitions 14 of the third type having a relatively small area. Those partitions 14 of the plural types can be provided by arbitrary numbers in arbitrary orders.

Figure 4B:
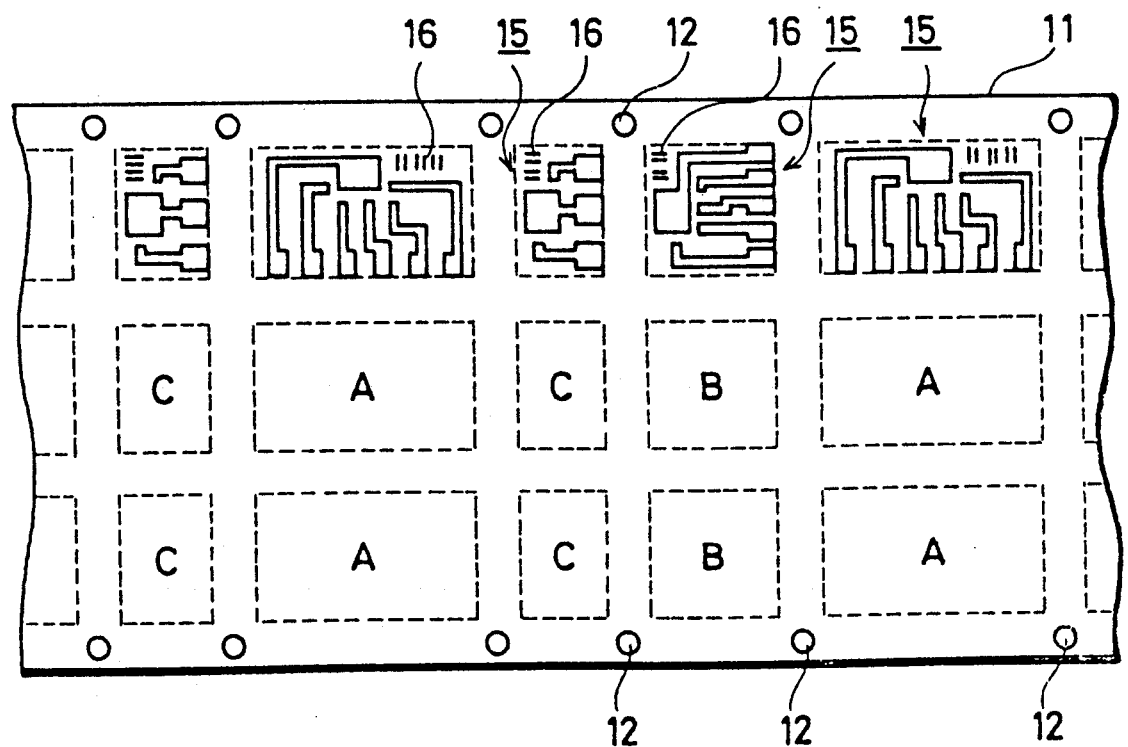

Referring to FIG. 4B, conductor patterns 15 are formed in each partition 14. The process of forming the conductor patterns 15 is the same as shown in FIGS. 3A to 3C. However, the three conductor patterns in the same partition are formed simultaneously (only the conductor pattern in the uppermost row is shown by way of example in FIG. 4B). More specifically, the type of silk screen in screen process printing is selected based on the intervals of the index holes 14 and the three conductor patterns in one partition 14 are formed simultaneously. In addition, simultaneously with the formation of the conductor patterns 15, a bar code 16 of a copper foil is formed as an identification mark for identifying the type of the conductor patterns 15.

Figure 4C:
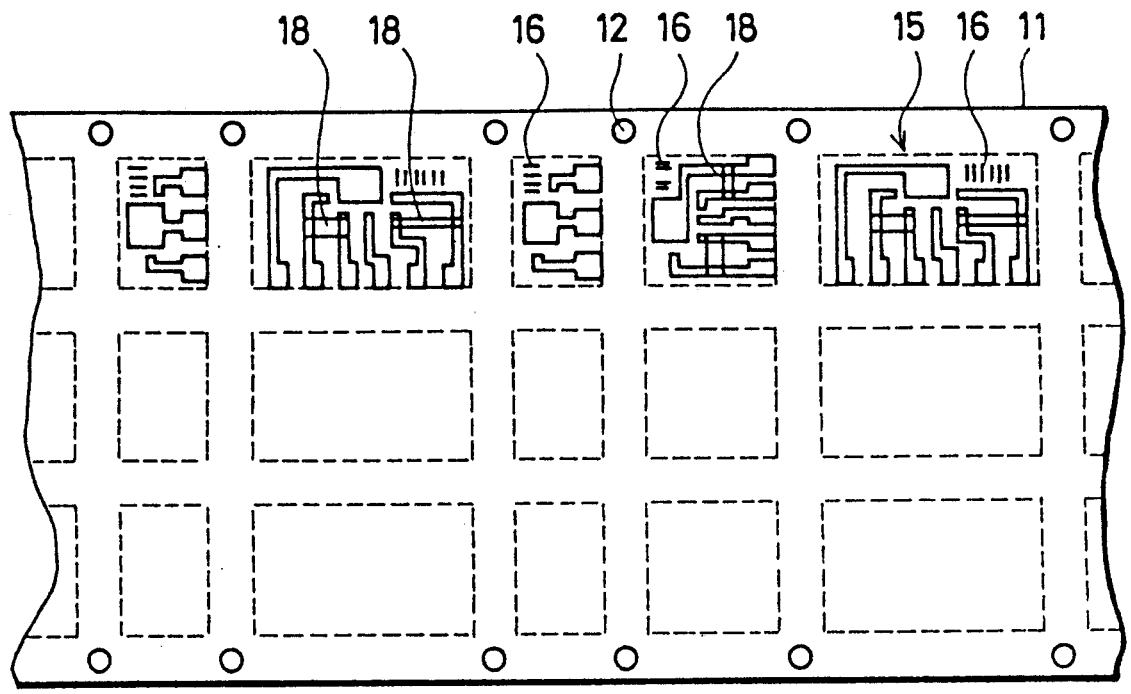

Referring to FIG. 4C, resistors 18 are printed and baked by resisting paste in a screen process. The process shown in FIGS. 4A to 4C is a common process required for any type of IC device.

Figure 4D:
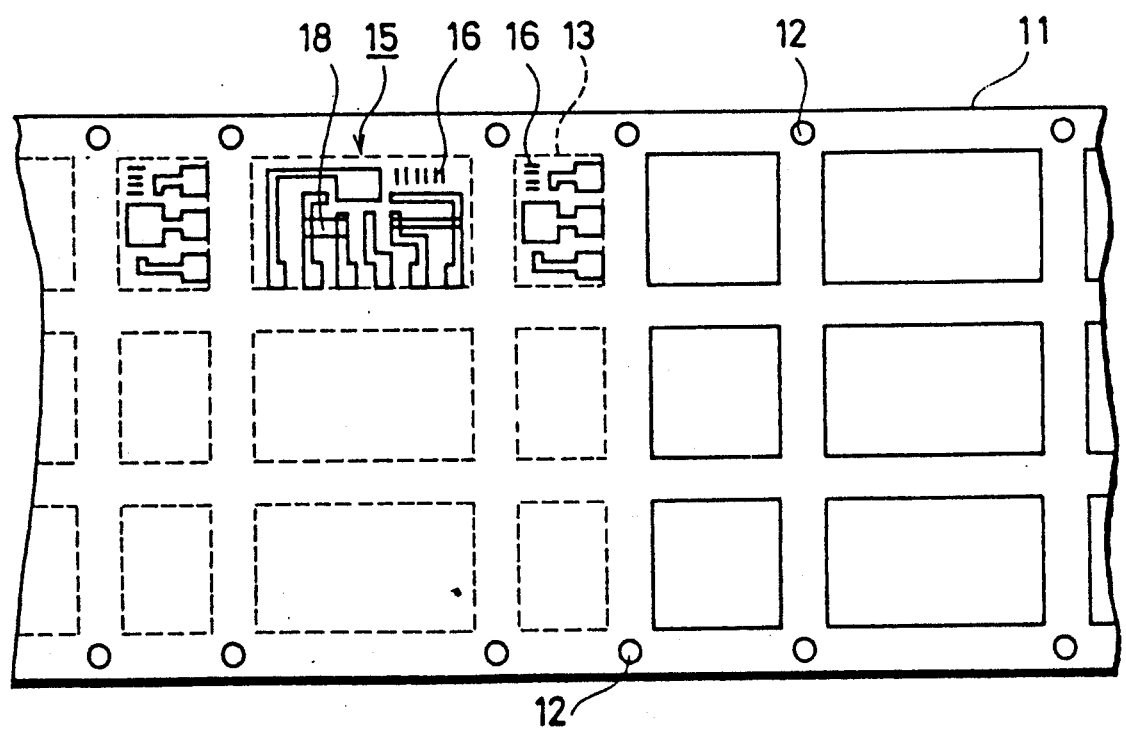

Referring to FIG. 4D, the substrate 11 where the conductor patterns 15 are formed is punched by a press machine for each individual substrate 13 which supports the corresponding conductor pattern 15. On this occasion, registration of a male mold and a circuit pattern is effected by utilizing the index holes 12. Only the peripheral portions of the male mold contact the ribbonlike substrate 11 to punch individual substrates 13 and accordingly no adverse effect is exerted in each circuit pattern 15.

Figure 4E:
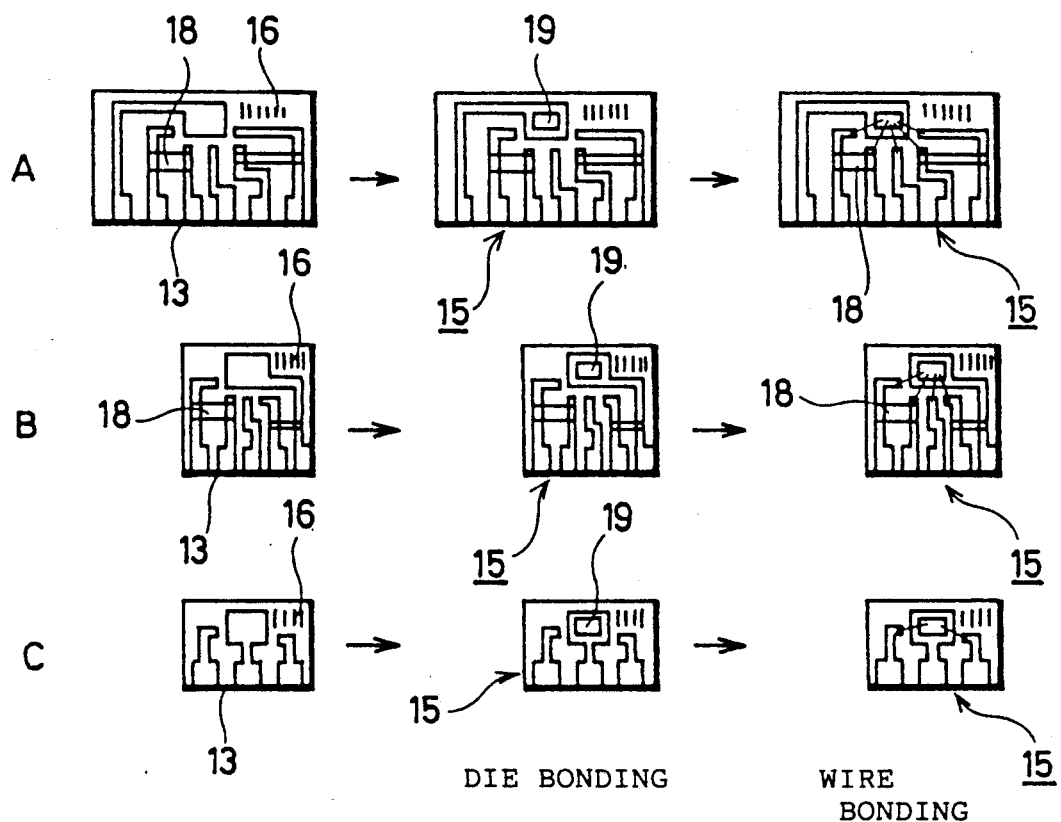

Referring to FIG. 4E, the separated individual IC device substrates 13 are classified into respective types A, B and C of the conductor patterns 15 based on the bar codes 16. The classified groups of the individual IC device substrates 13 are sent to corresponding dedicated assembling lines. In the assembling process of the IC devices, semiconductor IC dies, chip condensers, chip resistors and so on to be mounted are different dependent on the types of the individual IC device substrates 13. Accordingly, assembling is carried out in the respective dedicated assembling lines for the corresponding types of the IC device substrates 13, which makes it possible to improve the assembling efficiency remarkably. In each assembling line, a semiconductor IC die 19 corresponding to the type of the related conductor pattern is fixed in a desired position on the conductor pattern 15 by using the conductive paste, and chip components (not shown) such as condensers or resistors are soldered on the pattern 15. Then, an electrode on the semiconductor IC die 19 is connected to corresponding conductors in the conductor pattern 15 by wire bonding using fine wires of gold or aluminum. This wire bonding is carried out automatically by an ultrasonic bonding process or a nail head bonding process with pattern recognition using an automatic digital bonding device.

The IC devices thus assembled are subjected to functional tests. On this occasion, if the conductor pattern 15 includes a resistor pattern 18, functional trimming of that resistor pattern is also carried out. In addition, if a semiconductor IC die 19 does not function normally, it is replaced with a new semiconductor IC die and thus the production yield of IC devices can be improved. Further, if desired, the bonding intensity of the bonding wires can be measured. The semiconductor IC dies and the bonding wires can be protected by coating of silicon resin and they can also be protected by partial molding of transfer molding. External leads are soldered on the IC devices which have been tested, and after that each of the IC devices is enclosed in a resin case or sealed by dipping of epoxy resin. Thus, the respective IC devices are completed.

Figure 5:
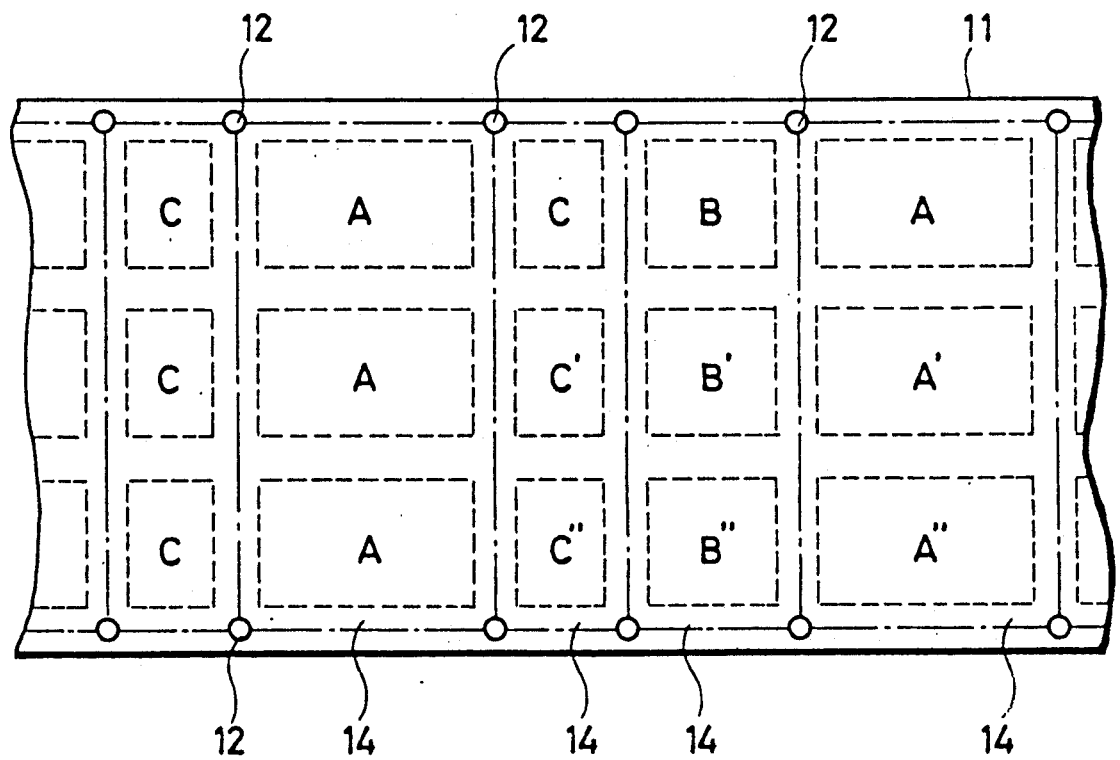
FIG. 5 is a plan view of a ribbonlike substrate used in another embodiment of the present invention.

Referring to FIG. 5, another embodiment of the present invention is illustrated. FIG. 5, which is similar to FIG. 4A, indicates that not only entirely the same conductor patterns A but also conductor patterns A' or A" having patterns of different types from that of the pattern A but having the same dimensions can be formed in each partition 14 of the first type for example. It will be understood that the same applies to the partitions 14 of the second and third types.

Figure 6:
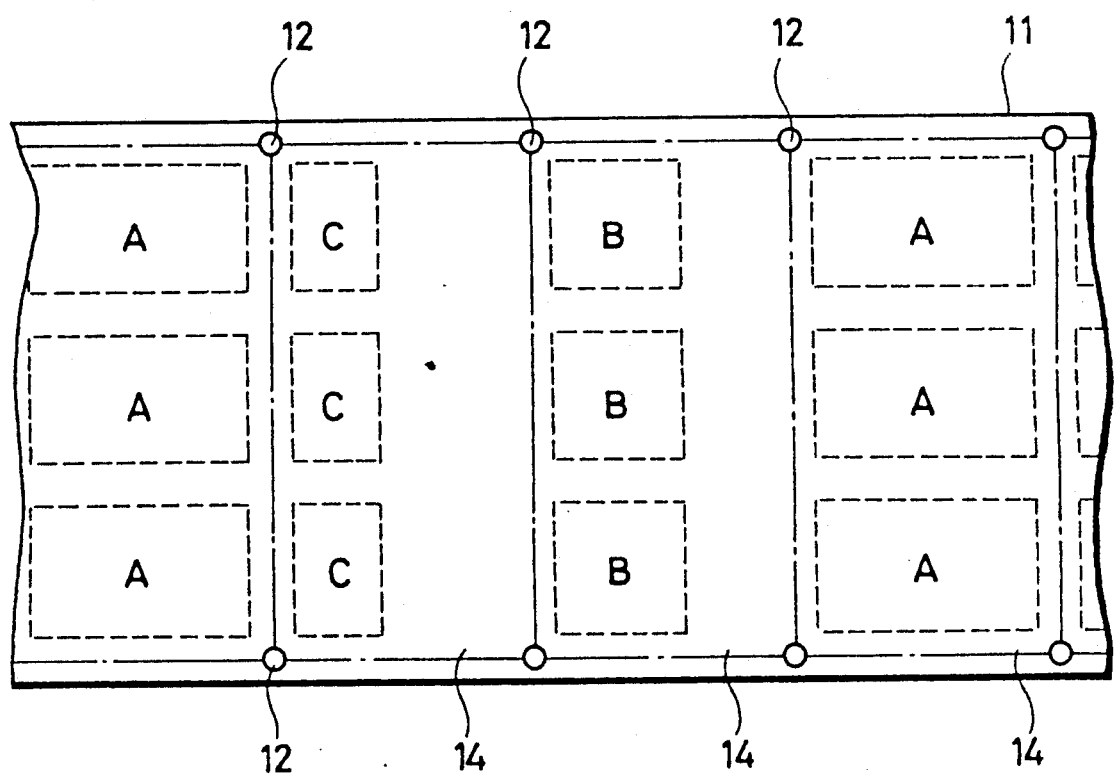
FIG. 6 is a plan view of a ribbonlike substrate used in still another embodiment of the present invention.

Referring to FIG. 6, still another embodiment of the present invention is illustrated. FIG. 6, which is similar to FIG. 4A, indicates that index holes 12 are formed at equal intervals. According to this embodiment, if the conductor patterns A, B, C have considerably different dimensions, the efficiency of use of the substrate 11 will be lowered but it becomes easy to control registration of the substrate 11 since the index holes 12 are provided at equal intervals.

Figure 7:
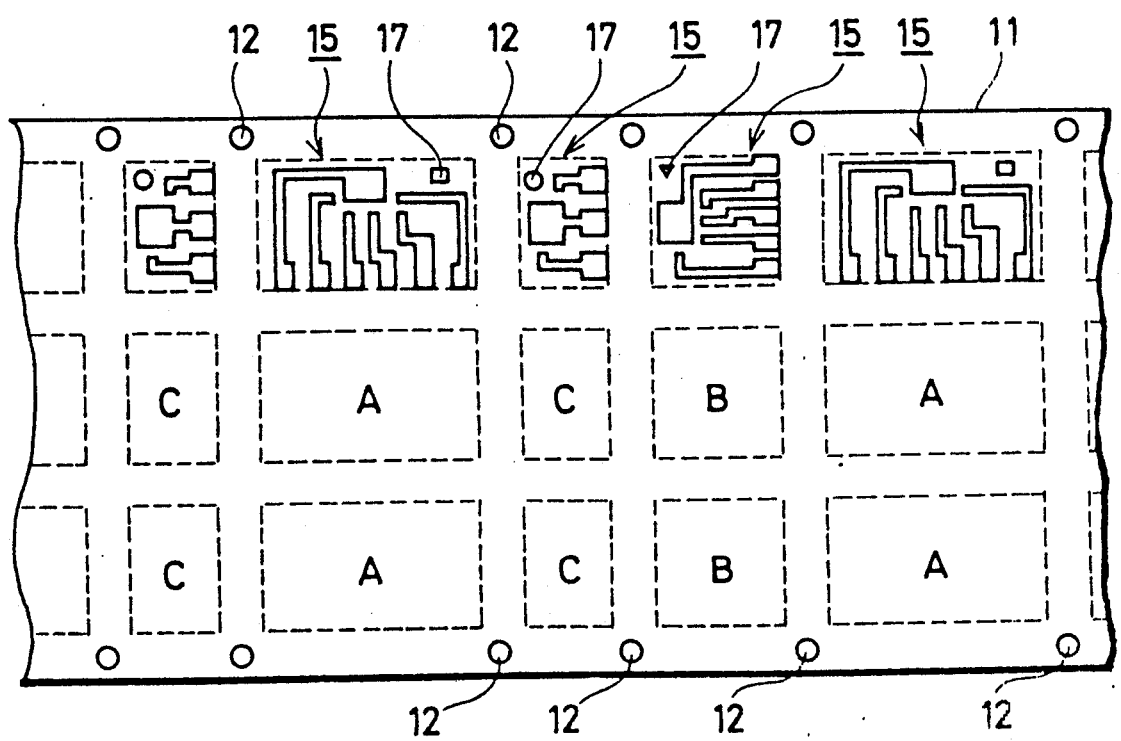
FIG. 7 is a plan view showing a further embodiment of the present invention.

Referring to FIG. 7, a further embodiment of the invention is illustrated. FIG. 7, which is similar to FIG. 4B, indicates that rectangular, triangular and round identification marks 17 are formed by punching in place of the bar codes 16 for identifying the types of the conductor patterns 15.

Figure 8A:
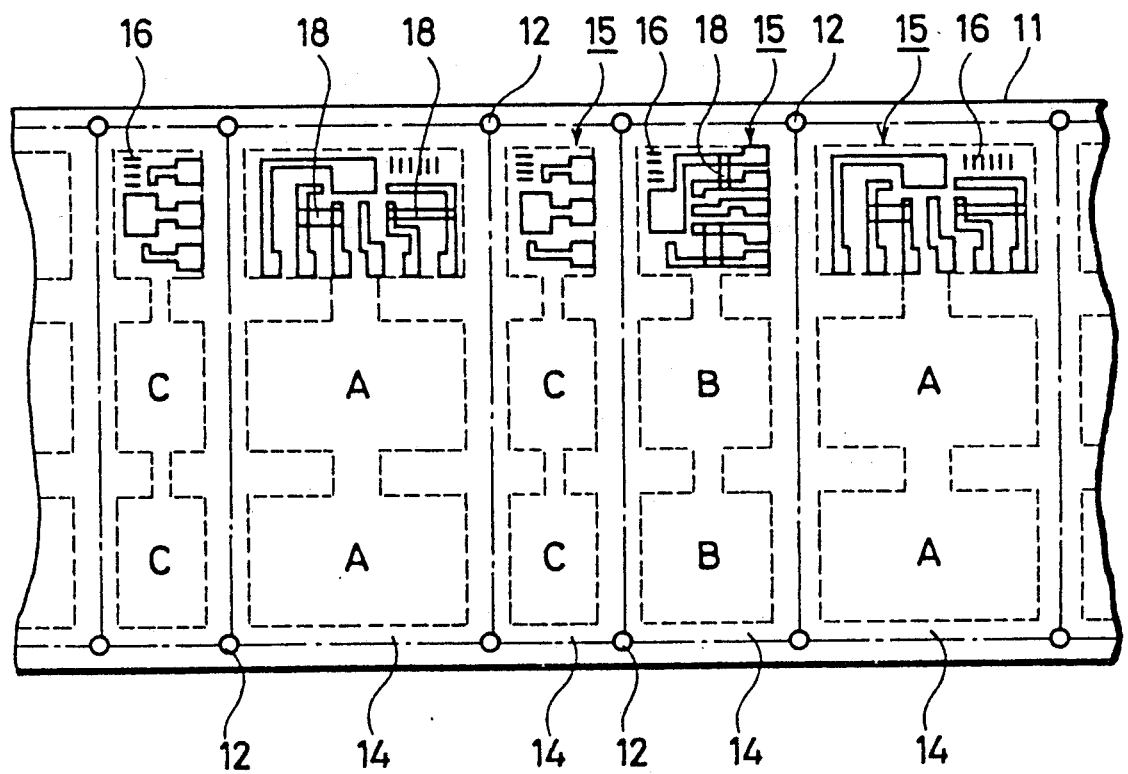
FIGS. 8A and 8B are plan views illustrating a method according to a still further embodiment of the present invention.
Figure 8B:
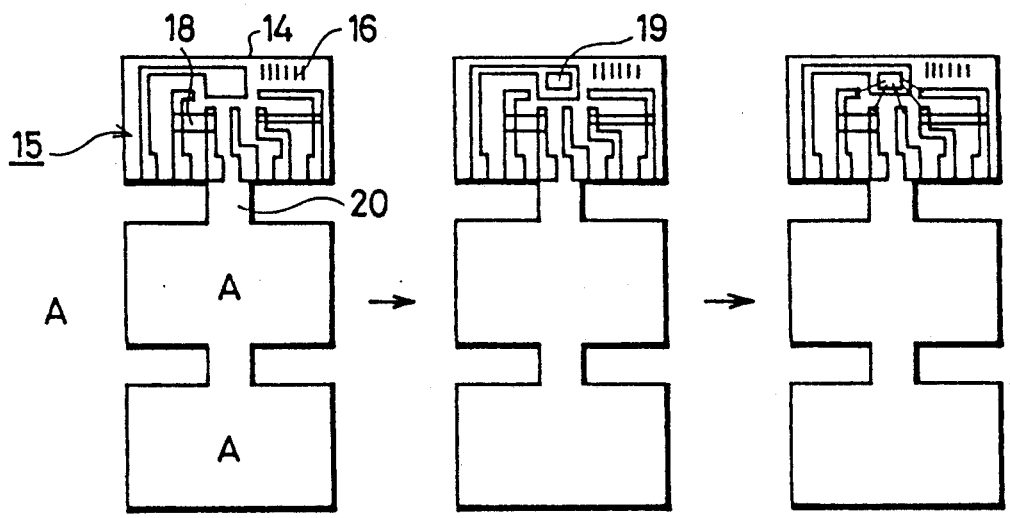
Figure 8B:
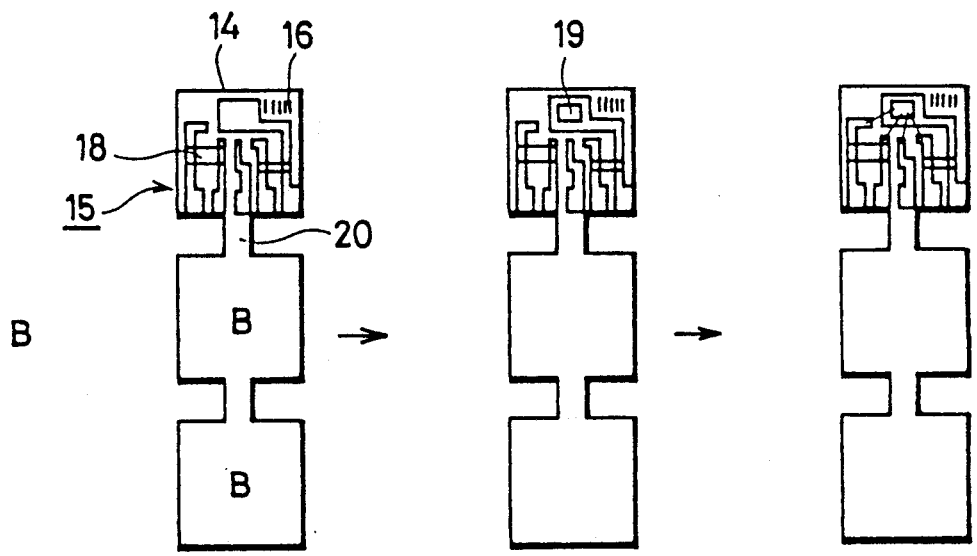
Figure 8B:
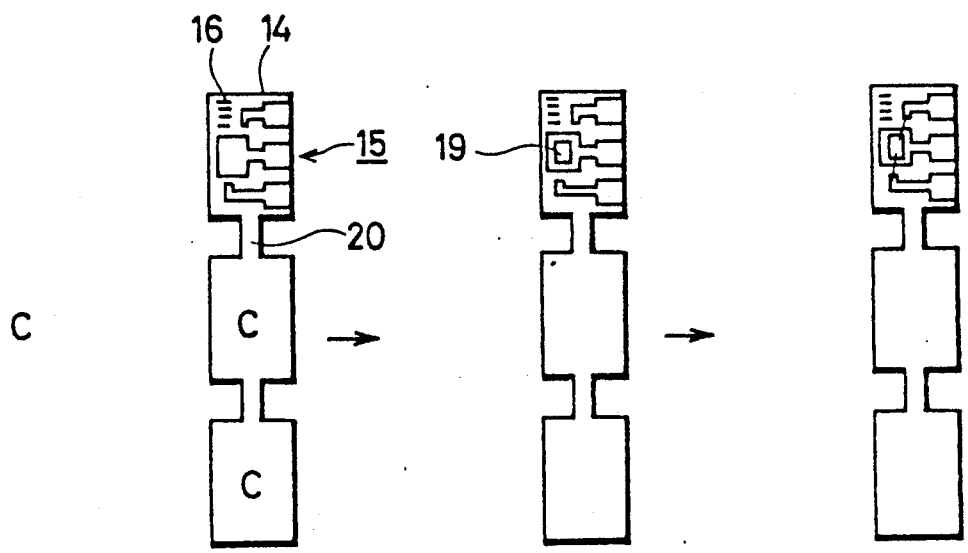

Referring to FIGS. 8A and 8B, a further embodiment of the invention is illustrated. According to this embodiment, a plurality of conductor patterns 15 in the same partition 14 are integrally punched by a connection band 20. The separated individual partitions are classified into different types based on bar codes 16 (or rectangular, triangular and round identification marks). In this case, the time required for the classification can be reduced compared with the case of classification for individual conductor patterns 15. The classified partitions 14 are sent to respective dedicated assembling lines. Then, after the IC devices are assembled, the connection band 20 in each of the partitions 14 is cut so that individual IC devices are separated.

Figure 9A:
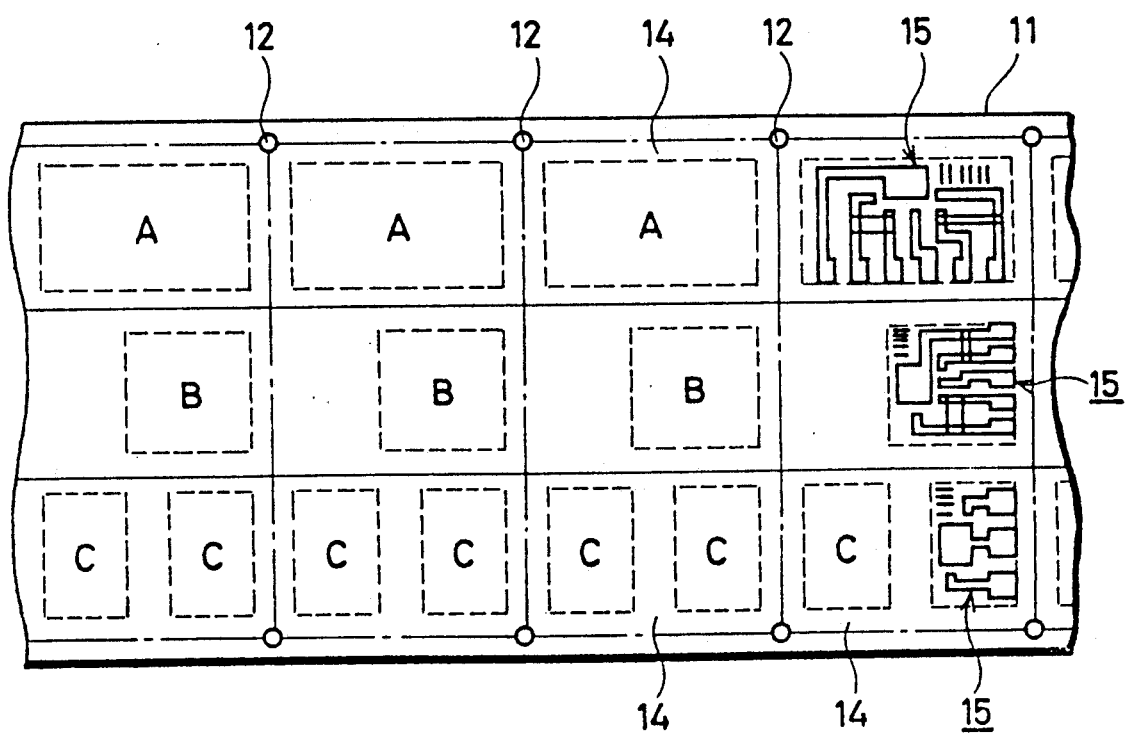
FIGS. 9A to 9C are plan views illustrating a method according to a still further embodiment of the present invention.
Figure 9B:
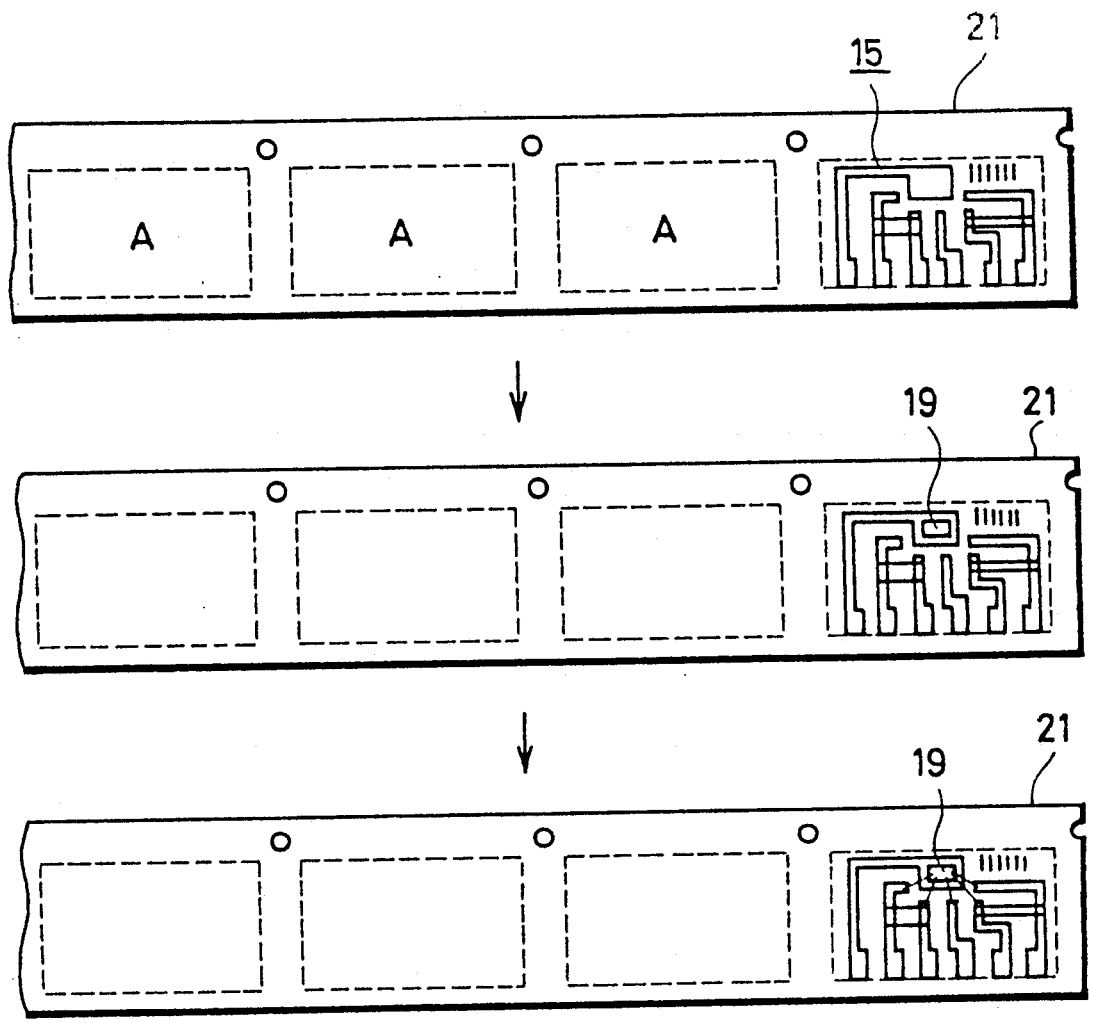
Figure 9C:
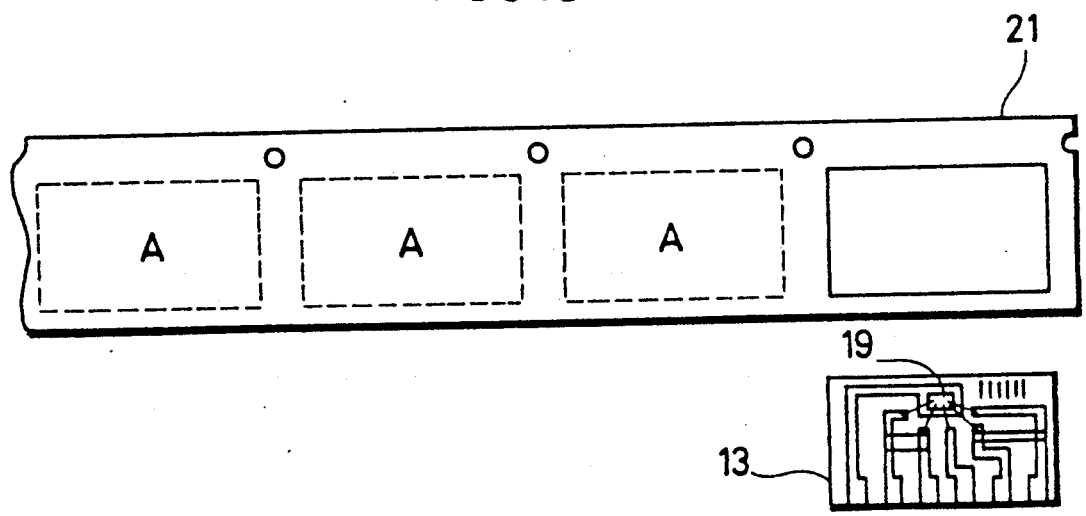

Referring to FIGS. 9A to 9C, a still further embodiment of the invention is illustrated. According to this embodiment, index holes 12 are formed at equal intervals. A plurality of conductor patterns 15 of different types are formed in one partition 14. Referring to FIG. 9A, a conductor pattern A is formed in the uppermost row of each partition 14, a conductor pattern B is formed in an intermediate row and two conductor patterns C are formed in the lowermost row. Thus, the upper row of the ribbonlike substrate 11 includes only the conductor patterns A and similarly the intermediate and lower rows include only the conductor patterns B and C, respectively. The ribbonlike substrate 11 provided with the conductor patterns 15 is cut for each of the upper, intermediate and lower rows along its length direction by using a dicing saw or the like. Each of the cut rows is further cut into strip substrates 21 of about 1000 mm in length. The time required for classification of the cut strip substrates 21 can be further reduced compared with the case of the embodiment shown in FIGS. 8A and 8B. This is because one strip substrate 21 includes a larger number of identical conductor patterns. FIG. 9B illustrates, by way of example, an assembling process of IC devices on a strip substrate 21 including only conductor patterns A. The IC devices formed on the strip substrate 21 are cut for each individual substrate 13.

Figure 10:
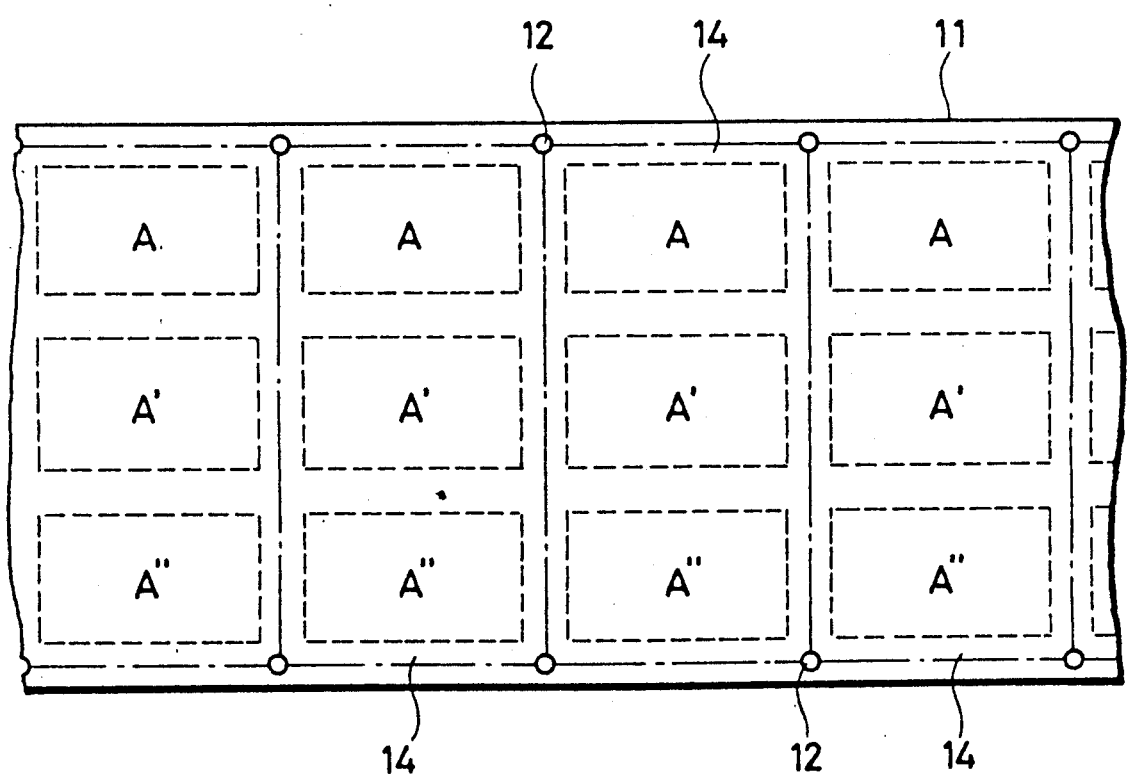
FIG. 10 is a plan view showing a still further embodiment of the present invention.

Referring to FIG. 10, a still further embodiment of the invention is illustrated. FIG. 10, which is similar to FIG. 9A, indicates that conductor patterns A, A' and A" having the same dimensions but different types are formed in each partition 11. The upper row of the ribbonlike substrate 11 includes only the same conductor patterns A. Similarly, the intermediate and lower rows include only the same conductor patterns A' and A", respectively. In this case, since the conductor patterns A, A' and A" have the same dimensions, the efficiency of use of the substrate 11 is enhanced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of mass-producing IC devices comprising the steps of:
    forming index holes at prescribed intervals in edge portions of both sides of a ribbonlike insulating substrate along its length direction, said index holes defining a plurality of types of partitions crossing said ribbonlike substrate in its width direction,
    forming a plurality of conductor patterns having the same dimensions in said partitions of the same type,
    separating said respective conductor patterns as individual IC device substrates from said ribbonlike substrate,
    classifying said IC device substrates according to the types of said conductor patterns,
    sending said IC device substrates having the same conductor pattern to the same dedicated assembling line,
    fixing a semiconductor IC die on each said IC device substrate, and
    wire-bonding an electrode on said semiconductor IC die to corresponding conductors in said conductor pattern.

2. The method of claim 1, wherein a plurality of conductor patterns having the same dimensions but different patterns are formed in at least one of said partitions of the same type.

3. The method of claim 1, wherein said conductor patterns include identification marks and said IC device substrates are classified according to the types based on said identification marks.

4. The method of claim 3, wherein said identification marks are bar codes.

5. The method of claim 1, wherein said conductor patterns are formed by utilizing resist patterns printed by a screen process.

6. A method of mass-producing IC devices, comprising the steps of:
    forming index holes at prescribed intervals in edge portions of both sides of a ribbonlike insulating substrate along its length direction, said index holes defining a plurality of partitions crossing said ribbonlike substrate in its width direction,
    forming a plurality of conductor patterns of a first type in one of said partitions and forming a plurality of conductor patterns of a second type in at least one of the remaining partitions,
    separating said respective conductor patterns as individual IC device substrates from said ribbonlike substrate,
    classifying said IC device substrates according to the types of the conductor patterns,
    sending said IC device substrates having the conductor patterns of the same type to the same dedicated assembling line, fixing a semiconductor IC die on each said IC device substrate, and wire-bonding an electrode on said semiconductor IC die to corresponding conductors in said conductor pattern.

7. The method of claim 6, wherein said conductor patterns include identification marks and said IC device substrates are classified according to the types based on said identification marks.

8. The method of claim 7, wherein said identification marks are bar codes.

9. The method of claim 6, wherein said conductor patterns are formed by utilizing resist patterns printed by a screen process.

10. A method of mass-producing IC devices, comprising the steps of:

forming index holes at prescribed intervals in edge portions of both sides of a ribbonlike insulating substrate along its length direction, said index holes defining a plurality of partitions crossing said ribbonlike substrate in its width direction, forming a plurality of same conductor patterns in said partitions of the same type, separating said respective partitions from said ribbonlike substrate, classifying said separated partitions according to the types, sending said partitions of the same type to the same dedicated assembling lines, fixing a semiconductor IC die on each of the conductor patterns in each said partition, wire-bonding an electrode on said semiconductor IC die to corresponding conductors in said conductor pattern, and thereafter separating the plurality of conductor patterns in each said partition.

11. The method of claim 10, wherein each said partition includes at least one identification mark and said respective partitions are classified according to the types based on said identification mark.

12. The method of claim 11, wherein said identification mark is a bar code.

13. The method of claim 10, wherein said conductor patterns are formed by utilizing resist patterns printed by a screen process.

14. A method of mass-producing IC devices, comprising the steps of:

forming index holes at prescribed intervals in edge portions of both sides of a ribbonlike insulating substrate along its length direction, said index holes defining a plurality of partitions crossing said ribbonlike substrate in its width direction, forming a plurality of conductor patterns of a first type in one of said partitions and forming a plurality of conductor patterns of a second type in at least one of the remaining partitions, separating said respective partitions from said ribbonlike substrate, classifying said separated partitions into groups according to the types of the conductor patterns, sending said partitions of the same group to the same dedicated assembling line, fixing a semiconductor IC die on each of the conductor patterns in each said partition, wire-bonding an electrode on said semiconductor IC die to corresponding conductors in said conductor pattern, and thereafter separating said plurality of conductor patterns in each said partition.

15. The method of claim 14, wherein each said partition includes at least one identification mark and said respective partitions are classified according to the types based on said identification mark.

16. The method of claim 15, wherein said identification mark is a bar code.

17. The method of claim 14, wherein said conductor patterns are formed by utilizing resist patterns printed by a screen process.

18. A method of mass-producing IC devices, comprising the steps of:

forming index holes at prescribed intervals in edge portions of both sides of a ribbonlike insulating substrate along its length direction, said index holes defining a plurality of partitions crossing said ribbonlike substrate in its width direction, forming conductor patterns of a plurality of types in each said partition in an arrangement following a prescribed order from one of said edge portions, thereby forming a plurality of types of rows of said conductor patterns along the length direction of said ribbonlike substrate, separating said plurality of types of rows and cutting said rows with prescribed lengths to form a plurality of types of strip substrates, the strip substrates of the same type including a plurality of said conductor patterns of only the same type, classifying said strip substrates according to the types, sending said strip substrates of the same type to the same dedicated assembling line, fixing a semiconductor IC die on each of the conductor patterns in each said strip substrate, wire-bonding an electrode on said semiconductor IC die to corresponding conductors in said conductor pattern, and thereafter separating the plurality of conductor patterns in said strip substrate.

19. The method of claim 18, wherein said plurality of types of conductor patterns have different patterns but have the same dimensions.

20. The method of claim 18, wherein said plurality of types of conductor patterns in the plurality of partitions included in one of said prescribed lengths are different from the plurality of types of conductor patterns in the plurality of partitions included in at least other one of said prescribed lengths.

* * * * *